(12) United States Patent
Chabas et al.

(10) Patent No.: US 9,322,224 B2
(45) Date of Patent: Apr. 26, 2016

(54) CONTACTLESS DATA COMMUNICATIONS COUPLING

(75) Inventors: Jean-Alain Chabas, Cesson Sevigne (FR); Brian Minnis, West Sussex (GB)

(73) Assignee: VALLOUREC DRILLING PRODUCTS FRANCE, Cosne-Cours-sur-Loire (FR)

( * ) Notice: Subject to any disclaimer, the term of this patent is extended or adjusted under 35 U.S.C. 154(b) by 486 days.

(21) Appl. No.: 13/821,462

(22) PCT Filed: Sep. 21, 2011

(86) PCT No.: PCT/EP2011/066418
§ 371 (c)(1),
(2), (4) Date: Mar. 7, 2013

(87) PCT Pub. No.: WO2012/038468
PCT Pub. Date: Mar. 29, 2012

(65) Prior Publication Data
US 2013/0169385 A1 Jul. 4, 2013

(30) Foreign Application Priority Data
Sep. 24, 2010 (FR) ...................... 10 57724

(51) Int. Cl.
*E21B 17/02* (2006.01)
*H01P 5/02* (2006.01)
(Continued)

(52) U.S. Cl.
CPC ............. *E21B 17/028* (2013.01); *E21B 47/122* (2013.01); *H03H 7/00* (2013.01)

(58) Field of Classification Search
CPC ...... E21B 17/028; E21B 47/122; E21B 17/07

USPC ..... 340/854.4, 854.6, 855.1; 333/24 R, 24 C, 333/219
See application file for complete search history.

(56) References Cited

U.S. PATENT DOCUMENTS 3,617,607 A * 11/1971 Williams ............... H03H 7/004
174/360
5,557,290 A * 9/1996 Watanabe ............ H01Q 1/1285
343/713

(Continued)

OTHER PUBLICATIONS

U.S. Appl. No. 13/822,136, filed Mar. 11, 2013, Chabas, et al.
(Continued)

*Primary Examiner* — Dean Takaoka
*Assistant Examiner* — Alan Wong
(74) *Attorney, Agent, or Firm* — Oblon, McClelland, Maier & Neustadt, L.L.P.

(57) ABSTRACT

A coupler for coupling a first and a second section of a transmission line embedded in a first and a second component respectively, includes a first half-coupler including a first electrically conductive housing, a first electrically conductive structure, and a first structure of dielectric material, and a second half-coupler including a second electrically conductive housing, a second electrically conductive structure, and a second structure of dielectric material. When the first and second components are connected end-to-end, the first and second housings come into contact to form together an electromagnetic cavity, inside which the first and second conductive structures are separated from each other by the first and second dielectric structures, so as to allow the first and second conductive structures to be in electromagnetic communication with each other.

12 Claims, 7 Drawing Sheets

(51) Int. Cl.
*E21B 47/12* (2012.01)
*H03H 7/00* (2006.01)

(56) References Cited

U.S. PATENT DOCUMENTS

| | | | |
|---|---|---|---|
| 5,977,841 A * | 11/1999 | Lee | H01P 1/045 333/24 C |
| 7,190,280 B2 * | 3/2007 | Hall et al. | 340/855.1 |
| 7,362,235 B1 | 4/2008 | Normann et al. | |
| 2004/0221995 A1 | 11/2004 | Hall et al. | |
| 2005/0236160 A1 | 10/2005 | Hall et al. | |
| 2008/0074226 A1 | 3/2008 | Hall et al. | |
| 2011/0155470 A1 | 6/2011 | Boulet | |
| 2011/0290475 A1 | 12/2011 | David et al. | |
| 2012/0048623 A1 | 3/2012 | Lafuente et al. | |
| 2012/0111555 A1 | 5/2012 | Leveau et al. | |
| 2012/0122330 A1 | 5/2012 | Roussie | |

OTHER PUBLICATIONS

International Search Report Issued Oct. 10, 2011 in PCT/EP11/66418 Filed Sep. 21, 2011.

* cited by examiner

CONTACTLESS DATA COMMUNICATIONS COUPLING

1. FIELD OF THE INVENTION

The present invention relates to the field of coupling devices (also called couplers) for coupling sections of transmission line used in data transmission systems, particularly (but not exclusively) data transmission systems suitable for use in downhole environments, such as along a drill string used in oil and gas exploration, or along other components used in oil and gas production.

2. TECHNOLOGICAL BACKGROUND

It is sought more particularly here below in this document to describe problems existing in the field of drilling pipes. The invention of course is not limited to this particular field of application, but is of interest for any technique that implements a structure comprising at least two components designed for being connected end-to-end (e.g. drilling chain comprising a plurality of pipes) and to which it is intended to associate a data transmission line.

Figure 1:
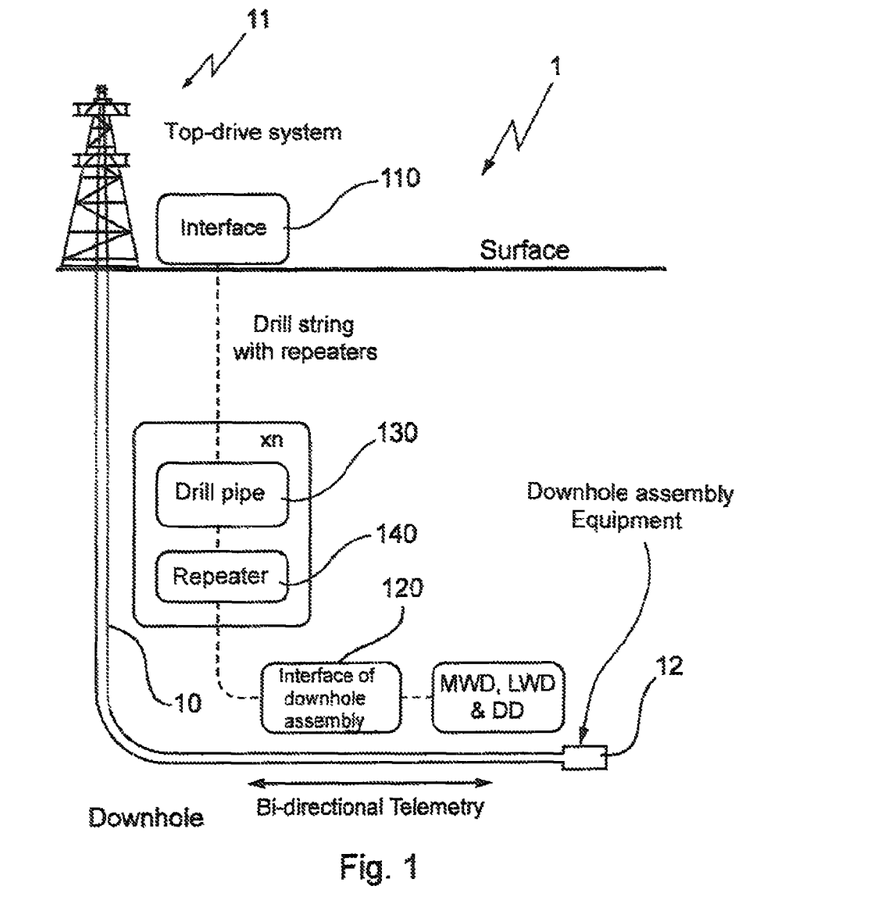
FIG. 1 depicts a drilling installation, for illustrative purposes.

For illustrative purposes, FIG. 1 depicts a drilling installation 1 comprising a string of drilling tools 10 that convey drilling fluid and rotational power from the top-drive system 11 (denoted hereafter TDS) on the surface down to the bottom-hole assembly 12 (denoted hereafter BHA) and drill bit underground. Most of these tools are drill pipes (e.g. of downhole components) of length typically 10 m, which are mechanically connected to each other by pin and box threaded end sections. As the total distance between the BHA 12 and the TDS 11 at the surface can be in excess of 3 km, there can be as many as 300 separate sections of drill pipe. Mud and other drilling fluids pass through the centre of the pipes, where operating temperatures can reach more than 200° C.

In the underground drilling industry, high-speed, bi-directional data communications are required between the TDS 11 and the BHA 12. High-speed data communications of this type can substantially increase the efficiency of the drilling rig by facilitating much improved "Measurement While Drilling (MWD)", "Logging While Drilling (LWD)" and "Directional Drilling (DD)" whilst reducing non-productive time. Real-time, rapid data collection (such as temperature, pressure, salinity, etc.) in the uplink direction and corresponding control data sent in the downlink direction enable optimisation of the drilling process for more accurate well placement and extended reach without the need for a suspension of operations. Unfortunately, such is the structure of the drilling installation and the environmental conditions in which it must operate that reliable, fast, bi-directional data communications are very difficult to provide.

A first known data communication system for use in a drill string is based on a mud pulse technique. This technique consists of sending sonic pulses up and down the drilling fluid in the pipes. The chief drawbacks to this mud pulse system are that the data rate is slow, i.e. less than 10 baud, the system is complex and expensive, the results can be inconsistent, and the range of performance can be limited. Thus, this first known system tends to be used only as an emergency back-up when all other means of communication have failed.

To achieve much higher data rates, it is known in the state of the art to use a transmission line inserted into the string of drill pipes to make a connection between an electronic data interface 110 at the surface of the rig and a downhole interface 120 underground. However, given the necessity of using separate sections of pipe and the way in which they must be assembled on site, the transmission line cannot be a single length of line, but must also be a series of separate sections whose length is roughly equal to that of the drill pipes, and whose ends must be coupled together by a coupling device to ensure reliable data communications along the entire length of the link, at all times and under all operating conditions.

The electrical losses along the length of the data link in the drill string must be kept within manageable limits, so as to ensure that the transmitted signal from one end reaches the receiver at the other end with an adequate signal-to-noise ratio. Due to the length of the drill string, the individual drill pipes (called Wired Drill Pipes or WDPs) are assembled into groups 130, each group of which interfaces to its neighbor via a repeater 140. The role of the repeater is to detect and demodulate the incoming signals arriving from both the uplink and downlink directions, remove unwanted noise, regenerate and amplify the required signals and pass them onto the next group of pipes and repeater. As illustrated in FIG. 1, there will be several of these pipe groups 130 and repeaters 140, the exact number depending upon the power budget for the whole link. However, the number of repeaters must be kept as low as possible to minimize both the cost of installation and maintenance. The repeaters are generally battery powered. Hence, it is essential that the losses both in the sections of the passive transmission line and the coupling devices are kept as low as is technically feasible.

Different data communication systems using transmission line and coupling devices have been proposed.

A second known data communication system uses a transmission line passing down the length of the drill string, whereby the separate sections of transmission line are connected together with specially-designed electrical connectors. This second system suffered badly from the lack of reliability in the electrical connections due to the presence of oil, grease, water, sand and other abrasive materials at the site of the joint.

A third known system is presented in the patent document U.S. Pat. No. 6,670,880 B1. This system uses coupling devices based on magnetic coupling. Embedded in the shoulders of each end of a drill pipe is a hollow ring of electrically insulating, magnetic material, inside of which is located a coil of wire. In operation, i.e. when the ends of the first and second pipes come together, a varying current applied to the first coil of the first pipe generates a varying magnetic field in the first electrically insulating, magnetic ring of the first pipe, which varying magnetic field is conducted to, and thereby produces a varying magnetic field in, the second electrically insulating, magnetic ring of the second pipe, which magnetic field thereby generates a varying electrical current in the second coil of the connected second pipe. The coupling is substantially independent of the angular orientation of the two pipes and is not reliant on any electrical connection. This system permits reliable, bi-directional data transmission along the drill string at data rates of about 50 kbits/s. However, higher data rates are difficult to achieve owing to the use of magnetic materials and the relatively high inductance of the coupled coils.

3. AIMS OF THE INVENTION

The invention in at least one of its embodiments is aimed at overcoming these different drawbacks of the prior art.

More specifically, an objective of at least one embodiment of the invention is to provide a coupler that permits reliable, bi-directional data transmission along a pair of components (e.g. drill pipes) connected end-to-end at data rates greater than 50 kbits/s. To make the further advances in drilling performance now being demanded by industry, the data rates must be increased towards a new target value of about 50 Mb/s.

Over the course of time, the angular variation of one pipe with its neighbor pipe can vary by up to ±135° due to wear and tear of the threads. Thus, another aim of at least one embodiment of the invention is to provide a coupler of this kind that makes it possible to achieve low-loss transmission over a wide range of radio frequencies for angles of rotation extending between 0° and ±135°.

Another aim of at least one embodiment of the invention is to provide a coupler of this kind that can be rapidly and safely formed, when two adjacent components are connected end-to-end.

Another aim of at least one embodiment of the invention is to provide a coupler of this kind that can be used with all existing downhole pipes used in oil and gas exploration and production.

Another aim of at least one embodiment of the invention is to provide a coupler of this kind that costs little to manufacture.

4. SUMMARY OF THE INVENTION

According to a first aspect of the present invention, a coupler is provided for coupling a first and a second section of a transmission line embedded in a first and a second component respectively. The coupler is such that it comprises:
  a first half-coupler comprising a first non-magnetic, electrically conductive housing adapted to be mounted at an end of the first component; a first electrically conductive structure; and a first structure of dielectric material;
  a second half-coupler comprising a second non-magnetic, electrically conductive housing adapted to be mounted at an end of the second component; a second electrically conductive structure; and a second structure of dielectric material.

The first section of the transmission line, respectively the second section, is electrically connected to the first conductive structure, respectively the second conductive structure.

When the first and second components are connected end-to-end, the first and second housings come into contact to form together an electromagnetic cavity inside which the first and second conductive structures are separated from each other by the first and second dielectric structures, so as to allow the first and second conductive structures to be in electromagnetic communication with each other.

The general principle of this embodiment of the invention therefore consists in taking advantage of an electromagnetic coupling to connect two sections of transmission line, thus making it possible to allow the two sections of transmission line to have a large angular uncertainty, while maintaining high data rate communication between these two sections.

This embodiment of the invention relies on a wholly novel and inventive approach to the coupling of two components, each of them embedding a section of transmission line. Indeed, it is proposed to equip each component end with a half-coupler such that when the two components are joined end-to-end, the two half-couplers come in contact so as to establish an electromagnetic communication link (inside the electromagnetic cavity) through which the components can transmit RF signals. The electromagnetic coupling mechanism of the invention withstands the rotation of the two components around each other, i.e. the communication link is established regardless of the angular rotation of the first component with respect to the second component.

In comparison with the magnetic coupling mechanism described above in relation to the prior art, the electromagnetic coupling mechanism of the invention has reduced transmission losses, since it does not use any magnetic materials or elements, making it possible to achieve much higher data rates. Thus, the coupler of the present invention is particularly well suited for using in high-speed drill pipe telemetry system where sections of drill pipe are connected end-to-end.

Advantageously, the first and second housings have a U-shaped cross-section.

Thus, the manufacturing process can remain simple.

Advantageously, each of the first and second dielectric structures and each of the first and second conductive structures is ring-shaped.

Thus, the manufacturing process can remain simple.

Advantageously, the transmission line comprises at least one coaxial cable, each coaxial cable comprising at least one inner conductor and an outer conductor. The outer conductor of each coaxial cable is connected to the first and second housings.

In this way, the outer sheath of the coaxial cable will carry the RF currents of the propagating signal within the electromagnetic cavity, preventing the currents flowing on the surface of the components and incurring high transmission losses.

According to a particular mode of the invention, each of the first and second conductive structures comprises at least one full ring made of an electrically conductive material. Each full ring comprises at least one connection point, each connection point being connected to one of said inner conductor(s).

Advantageously, the transmission line comprises a coaxial cable comprising an inner conductor and an outer conductor. The outer conductor is connected to the first and second housings. Each of the first and second conductive structures comprises a full ring made of an electrically conductive material. Each full ring comprises a connection point being connected to the inner conductor; and a short circuit point diametrically opposed to the connection point and being connected to the respective housing.

According to another particular mode of the invention, each of the first and second conductive structures comprises at least one portion of a ring, made of an electrically conductive material, each portion of ring comprising a first end and a second end, each end being separated from another end by a gap.

In a preferred embodiment of the invention, each of the first and second conductive structures comprises a portion of a ring, made of an electrically conductive material and comprising a first end and a second end separated from each other by a gap. When the first and second components are connected end-to-end, the first and second conductive structures are facing each other such that:
  the first end of the first conductive structure and the first end of the second conductive structure are opposite to each other;
  the second end of the first conductive structure is located on one side of the first end of the first conductive structure;
  the second end of the second conductive structure is symmetrically located at the other side of the first end of the first conductive structure.

Advantageously, each first end is connected to one of said inner conductor(s), and each second end is free.

In another preferred embodiment of the invention, each first and second end is free. Each portion of ring comprises a connection point being located between the first end and the second end and being connected to one of said inner conductor(s).

Advantageously, each of the first and second housings comprises a bottom, a first side, a second side and an opening between the first and second sides. Each of the first and second dielectric structures comprises a rear layer of dielectric material extending in the bottom of the respective housing, and a front layer of dielectric material extending around the opening of the respective housing. Each of the first and second conductive structures is mounted in-between the respective rear and front layers.

In accordance with another aspect of the present invention, a system is provided for transmitting data through a first and a second section of a transmission line embedded in a first and a second component respectively.

The first component is such that it comprises the aforementioned first half-coupler at an end.

The second component is such that it comprises the aforementioned second half-coupler at another end.

When the first and second components are connected end-to-end, the first half-coupler and the second half-coupler come into contact to form together a coupler for coupling the first and second sections of transmission line.

In a preferred embodiment of the invention, each component is a drill pipe adapted to be used in oil and gas exploration or production.

In accordance with another aspect of the present invention, there a component is provided comprising:
the aforementioned first half-coupler at a first end;
the aforementioned second half-coupler at a second end.

5. LIST OF FIGURES

Other features and advantages of the invention shall appear from the following description, given by way of an indicative and non-restrictive example and from the appended drawings, of which:

FIG. 6b is a schematic cross-sectional view showing the coupler of FIG. 6a;

FIG. 7 is a perspective view showing the coupler of FIG. 6a;

FIG. 8b is a schematic cross-sectional view showing the coupler of FIG. 8a;

FIG. 9b is a schematic cross-sectional view showing the coupler of FIG. 9a;

6. DETAILED DESCRIPTION

The invention will be described, in at least one of its embodiments, with reference to the example of the drilling installation of FIG. 1. In this drilling installation, the electromagnetic coupler (i.e. coupling device) of the present invention is located in the sections of drill pipe. The invention is of course not limited to this particular example and may apply to any component string to which it is intended to associate a data transmission line.

Figure 2:
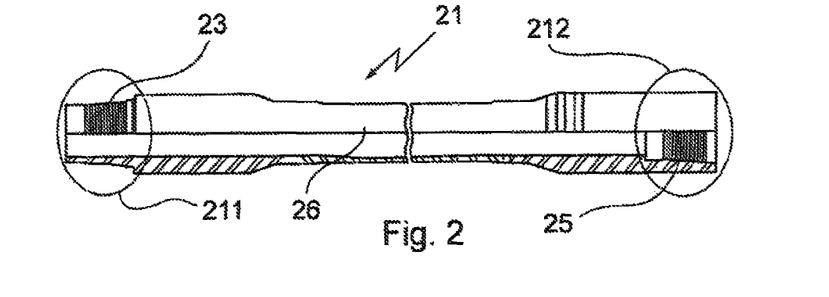
FIG. 2 is a cross-sectional view of a section of drill pipe including a first-half coupler at one end and a second-half coupler at the other end, according to a particular embodiment of the present invention.

FIG. 2 is a cross-sectional view of a section of drill pipe 21 including a first-half coupler at one end 211 and a second-half coupler at the other end 212, according to a particular embodiment of the present invention.

The depicted section 21 includes a pin end 211, having external tapered threads 23, and a box end 212, having internal tapered threads 25. Between the pin end 211 and box end 212 is the body 26 of the section. A typical length of the body 26 is 10 m. Drill strings in oil and gas production can extend as long as 3 km, which means that as many as 300 sections of drill pipe can be used in the drill string.

Figure 3:
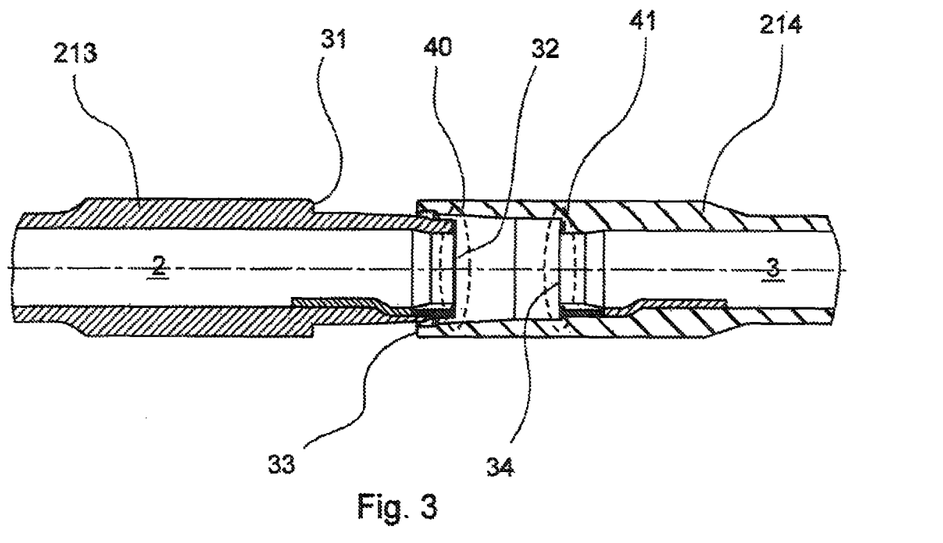
FIG. 3 is a cross-sectional view of a pin end of a first section of drill pipe unconnected to a box end of a second section of drill pipe.
Figure 4:
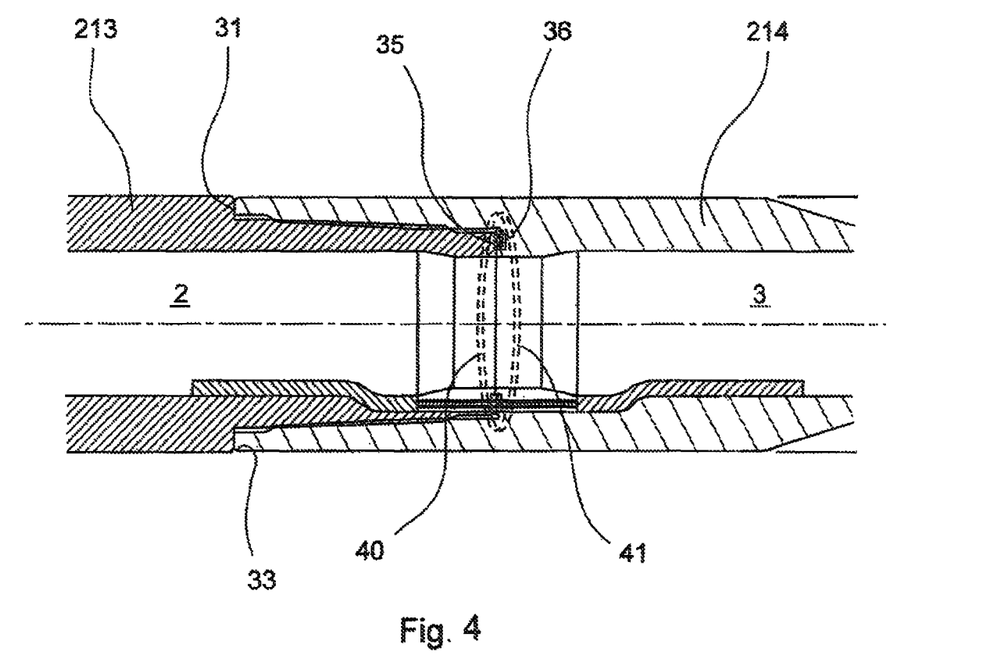
FIG. 4 is a cross-sectional view of the pin end of FIG. 3 connected to the box end of FIG. 3.
Figure 5:
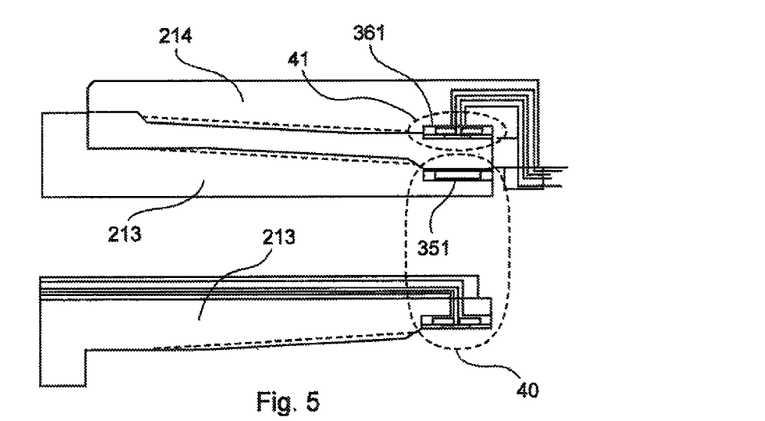
FIG. 5 is a cross-sectional view similar to FIG. 3 showing an alternative placement of the first and second half-couplers according to a particular embodiment of the present invention.

FIGS. 3, 4 and 5 depict a pair of drill pipes including a first section of drill pipe 2 comprising a first-half coupler 40 according to the invention, and a second section of drill pipe 3 comprising a second-half coupler 41 according to the invention. In operation, the first and second sections of drill pipe are connected end-to-end so as to allow the first-half coupler 40 and the second-half coupler 41 to make contact and form the coupler of the invention.

As shown in FIG. 3, the pin end 213 of the first section of drill pipe 2 includes an external, primary shoulder 31, and an internal, secondary shoulder or face 32. The box end 214 of the second section of drill pipe 3 includes an external, primary shoulder 33 and an internal, secondary shoulder or face 34.

As shown in FIG. 4, when the first and second sections of drill pipe are connected end-to-end, the pin end 213 of the first section of drill pipe 2 is threaded into the box end 214 of the second section of drill pipe 3 with sufficient force so that the primary external shoulder 31 on the pin end 213 engages the primary shoulder 33 on the box end 214. As a result of this connection, the secondary shoulder 32 on the pin end 213 is reliably brought into close proximity or contact with the secondary shoulder 34 on the box end 214.

The pin end 213 preferably includes a recess 35 in the secondary shoulder 32. Preferably, the recess is located so as to lie equidistant between the inner and outer diameter of the secondary shoulder 32. The box end 214 also includes a recess 36 similar to the recess 35 in the pin end 213, except that the recess 36 is formed in the internal, secondary shoulder 34 of the box end 214 of the second section of drill pipe.

As can be seen in FIG. 4, the recesses 35 and 36 are preferably configured so as to open axially, that is, in a direction parallel to the length of the drill string.

In an alternative embodiment shown in FIG. 5, the recesses 351 and 361 are located on the outside diameter of the pin end 213 of the first section of drill pipe and on the inside diameter of the box end 214 of the second section of drill pipe. In this way, the recesses 351 and 361 are configured so as to open radially, that is, in a direction perpendicular to the length of the drill string.

In the particular embodiments illustrated in FIGS. 3, 4 and 5, the first half-coupler 40 of the present invention is located within the recess 35 or 351 and the second half-coupler 41 of the present invention is located within the recess 36 or 361.

As shown in the examples of FIGS. 6a, 6b, 7, 8a, 8b, 9a, and 9b, the coupler comprises:

a first half-coupler 40a, 40b, 40c comprising a first non-magnetic, electrically conductive housing 61a, 61b, 61c adapted to be mounted at an end of a first section of drill pipe. As shown in the examples of FIGS. 3 and 4, the first housing 61a, 61b, 61c is designed to be housed within the recess 35 of the pin end 213; and a second half-coupler 41a, 41b, 41c comprising a second non-magnetic, electrically conductive housing 62a, 62b, 62c adapted to be mounted at an end of a second section of drill pipe. As shown in the examples of FIGS. 3 and 4, the second housing 62a, 62b, 62c is designed to be housed within the recess 36 of the box end 214.

Figure 6A:
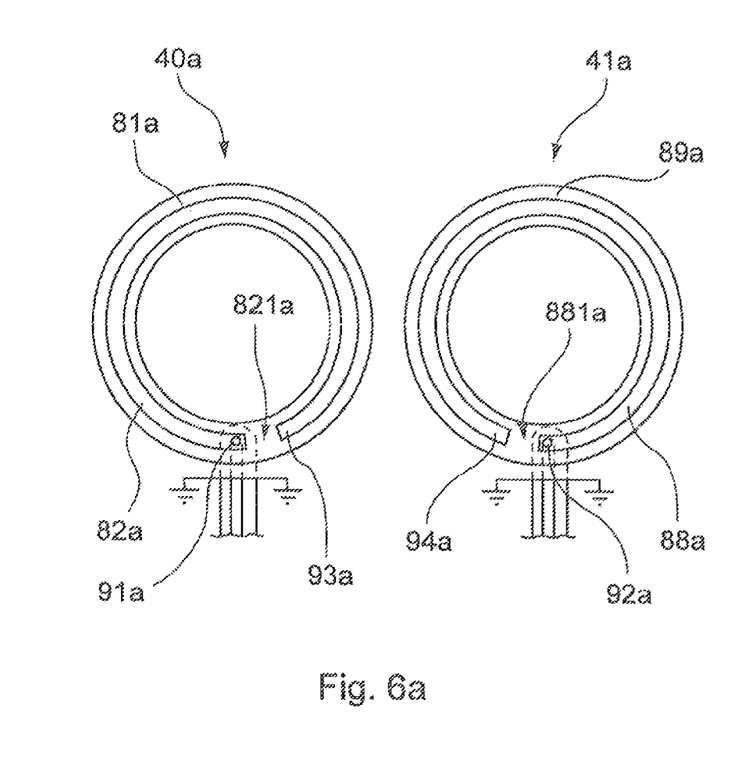
FIG. 6a is a schematic exploded axial view of a first particular embodiment of the coupler of the present invention.
Figure 6B:
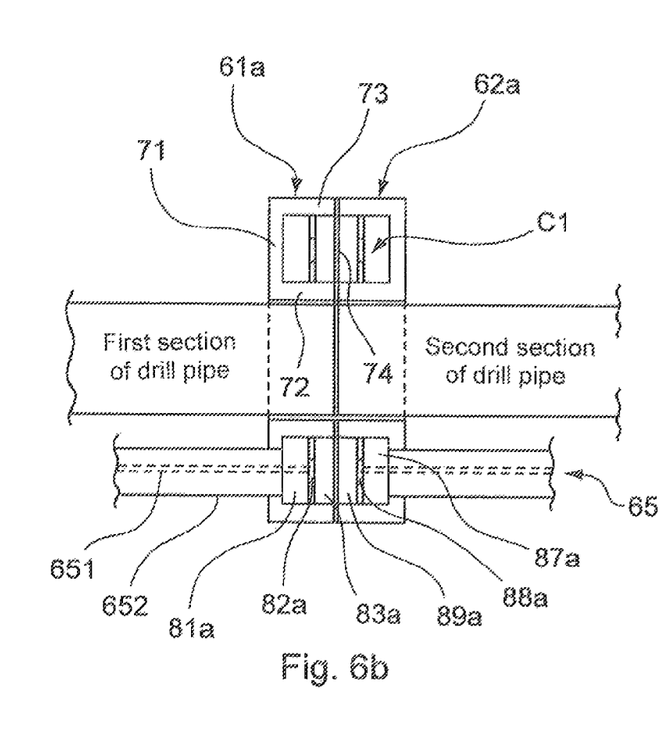

As shown in the example of FIG. 6b, the cross-section of the first housing 61a is U-shaped. The first housing 61a comprises a bottom 71, a first side 72 and a second side 73, thus forming an opening 74 between the two sides. The first housing 61a is made of copper to prevent currents flowing in the steel of the drill pipes, which would otherwise cause undesirable transmission losses. In an alternative embodiment, the first housing 61a is made of copper and is plated with a precious metal, for example gold, to prevent surface oxidation.

As shown in the example of FIG. 6b, the second housing 62a is similar in shape and in size to the first housing 61a.

As can be seen in the examples of FIGS. 6a, 6b, 7, 8a, 8b, 9a, and 9b, the first half-coupler 40a, 40b, 40c comprises a set of round, hollow, multi-layer discs of dielectric material 81a, 83a, 81b, 83b, 81c, 83c (also called hereafter first structure of dielectric material) and one or several (for example two) printed electrical conducting strip 82a, 82b, 82c and 82d (also called hereafter first electrically conductive structure) located at an appropriate distance from the opening of the first housing 61a, 61b, 61c.

The second half-coupler 41a, 41b, 41c comprises a set of round, hollow, multi-layer discs of dielectric material 87a, 89a, 87b, 89b, 87c, 89c (also called hereafter second structure of dielectric material) and one or several (for example two) printed electrical conducting strip 88a, 88b, 88c and 88d (also called hereafter second electrically conductive structure) located at an appropriate distance from the opening of the second housing 62a, 62b, 62c.

Figure 8A:
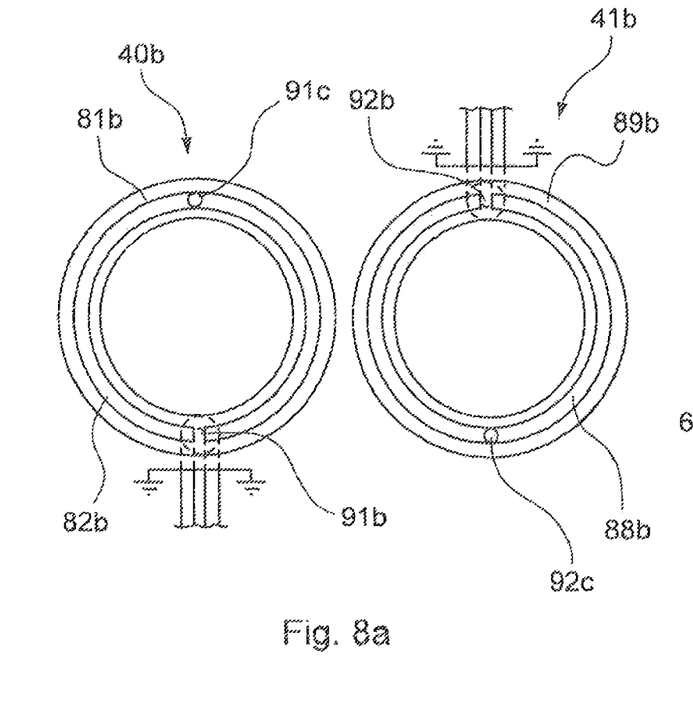
FIG. 8a is a schematic exploded axial view of a second particular embodiment of the coupler of the present invention.
Figure 8B:
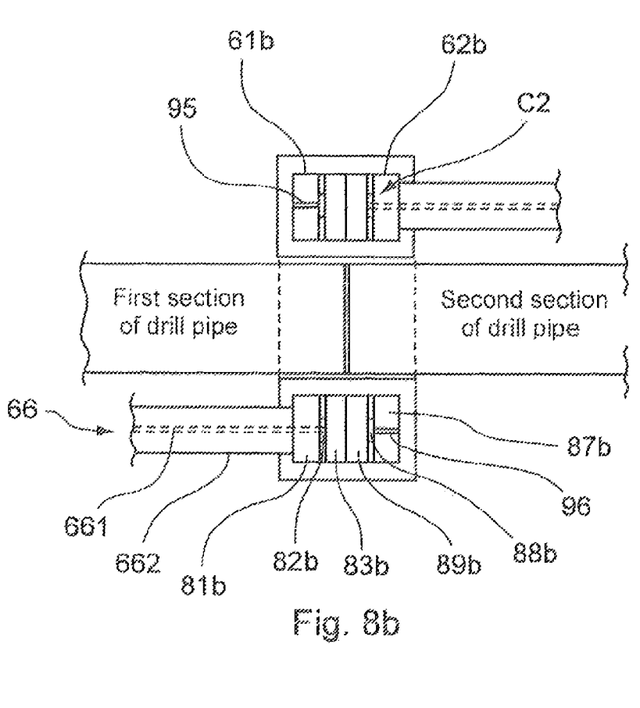
Figure 9A:
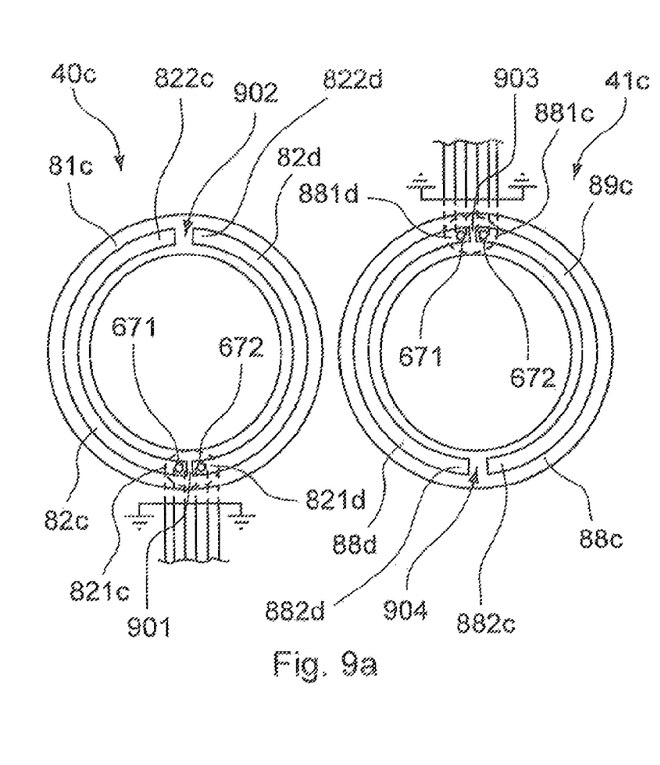
FIG. 9a is a schematic exploded axial view of a third particular embodiment of the coupler of the present invention.
Figure 9B:
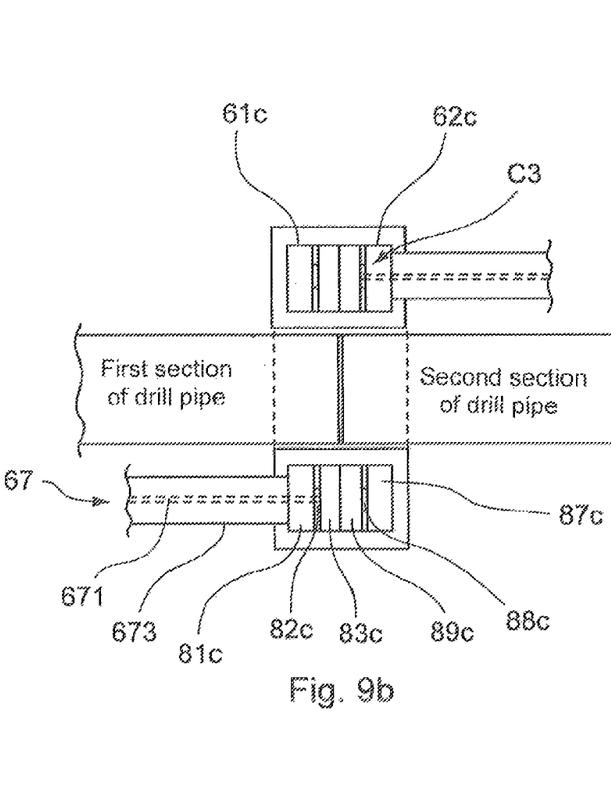

As shown in the examples of FIGS. 6b, 8b, and 9b, each conducting strip 82a, 82b, 82c, 82d, 88a, 88b, 88c or 88d are electrically connected to the central conductor of a transmission line 65, 66, 67 that runs through a cylindrical hole cut in the wall of each of the first and second sections of drill pipe between its two ends. Each conducting strip is made of copper. In an alternative embodiment, the copper can be plated with a precious metal, for example gold, to prevent surface oxidation.

As shown in the example of FIG. 6b, the multi-layer disc of dielectric material of the first half-coupler 40a comprises a rear layer 81a of dielectric material extending in the bottom 71 of the first housing and a front layer 83a of dielectric material extending around the opening 74 of the first housing. The multi-layer disc of dielectric material of the second half-coupler 41a comprises a rear layer 87a of dielectric material extending in the bottom of the second housing and a front layer 89a of dielectric material extending around the opening 74 of the second housing.

In operation, i.e. when the first and second sections of drill pipe are connected end-to-end, the first 61a and second housings 62a come into contact to form together an electromagnetic cavity C1, inside which the conducting strips 82a and 88a are electromagnetically coupled. Thus, in operation, and by judicious choice of the geometric shape of the conducting strips 82a and 88a, their length and separation, it is possible to achieve a very low-loss radiofrequency (RF) transmission of signals between the conducting strips 82a and 88a over a wide range of frequencies. In consequence, and as explained hereafter, data can be transmitted with high data rate through the transmission line.

FIGS. 6a and 6b present a first particular embodiment of the coupler of the present invention.

In this first particular embodiment, the transmission line 65 is an unbalanced coaxial cable, i.e. a coaxial cable comprising one inner conductor 651 and one outer conductor 652, with a characteristic impedance in the range of about 30 to about 120 ohms, most preferably with a characteristic impedance in the range of 50 to 75 ohms. In this first embodiment, the coaxial cable has transmission losses less than 1.67 dB/10 m for frequencies below 500 MHz.

In FIG. 6a, each of the first 40a and second 41a half-couplers is shown with the appropriate layer of dielectric material removed (83a and 87a, respectively), so as to reveal the shape of each of the conducting strips 82a and 88a beneath.

In this first particular embodiment, each of the conducting strips 82a and 88a has the shape of a split ring comprising a gap 821a and 881a, respectively. These gaps allow the desired coupling characteristics to be established. In order to ensure efficient coupling, the size of each gap should not be less than the thickness of the conducting strip, nor should it be wider than twice the width of the conducting strip.

Each conducting strip has the shape of a circular track with a small section removed close to the connection point 91a and 92a with the inner conductor 651 of the coaxial cable. Each conducting strip has a free end 93a and 94a (i.e. end being left open).

In operation, i.e. when the first and second sections of drill pipe are connected end-to-end, the conducting strips 82a and 88a are facing each other such that the connection point 91a and 92a are face-to-face. In other words, the connection point 91a and 92a are aligned according to a first axis defined by the length of the inner conductor 651 of the coaxial cable 65. In order to guarantee correct operation of the coupler, the gaps 821a and 881a are located on opposing sides of the connection points. In other words, when in operation, whilst the gap 821a is located at one side of the connection point 91a or 92a, the gap 881a is symmetrically located at the other side of the connection point 91a or 92a. Thus, in operation, the gap 821a of the first half-coupler 40a and the gap 881a of the second half-coupler 41a are not facing each other. This arrangement allows in a good frequency response to be obtained.

In the example illustrated in FIG. 6a, when in operation, the first half-coupler 40a should sit immediately above the second half-coupler 41a. That is to say, that in order to establish the correct positioning of the gaps 821a and 881a with respect to the connection points, the first half-coupler 40a must simply slide sideways over the second half-coupler 41a rather than be flipped over like the side of a book.

In the examples of FIGS. 6a and 6b, each conducting strip 82a and 88a takes the form of a copper track, one side of which is arranged to be in contact with the rear layer of dielectric 81a or 87a and the other side is arranged to be in contact with the front layer of dielectric 83a or 89a.

The copper tracks can either be etched from ready-clad dielectric material or cut from a solid sheet and set into a suitable recess in the dielectric.

When the first 40a and second 41a half-couplers are joined, they come under pressure in order to force out any residual water and debris. For example, front layer of dielectric 83a and 89*a* come under pressure with each other when assembled. They are in close contact configuration. To this end, front layers of dielectric may be made of industrial diamond, and for example made of zirconia. Those front layers may not be totally planar, and may include buckles that may facilitate evacuation of particles during makeup. During assembly of sections of drill pipes, those half couplers respectively 40*a* and 41*a* are rotated respective to each other, and any dust located between dielectric front layers is evacuated during the makeup. It is important to control the distance between electric layers and to avoid any particles between front layers of dielectric.

No electrical connection is required between the conducting strips 82*a* and 88*a* of the coupler, as the coupling mechanism is entirely electromagnetic. This allows the first and second half-couplers 40*a* and 41*a* to be free in rotation around each other. Thus, as it will be described hereafter in relation with FIG. 10, the coupling between the conducting strips 82*a* and 88*a*, i.e. the coupling between the first and second sections of transmission line (embedded in the first and second sections of drill pipe, respectively), is substantially independent of the angular orientation of the first section of drill pipe with respect to the second section of drill pipe.

The front and rear layers of dielectric material are preferably made of a dielectric material that is capable of withstanding relatively high compression forces, impervious to water and capable of operating at high temperatures. In a particular embodiment, the front and rear layers of dielectric material are made of glass reinforced PFTE (polytetrafluoroethylene) which is commercially available in sheet form, with or without copper cladding.

As can be seen in FIG. 6*b*, the conducting strip in each half-coupler is connected to the inner conductor 651 of the coaxial cable embedded in the wall of the section of drill pipe. The outer conductor 652 of the coaxial cable is connected to the non-magnetic, electrically conductive housing 61*a* and 62*a*, so as to carry the RF currents of the propagating signal, thus preventing the currents flowing in the steel wall of the drill pipe and incurring high transmission losses.

The above examples and the following examples are provided by way of illustration and explanation and as such are not to be viewed as limiting the scope of the present invention.

A 3D electromagnetic simulation was carried out. CST Microwave Studio (TM registered) software has been used to simulate the performances in terms of insertion loss (S21) of the first embodiment of FIGS. 6*a* and 6*b*.

Figure 7:
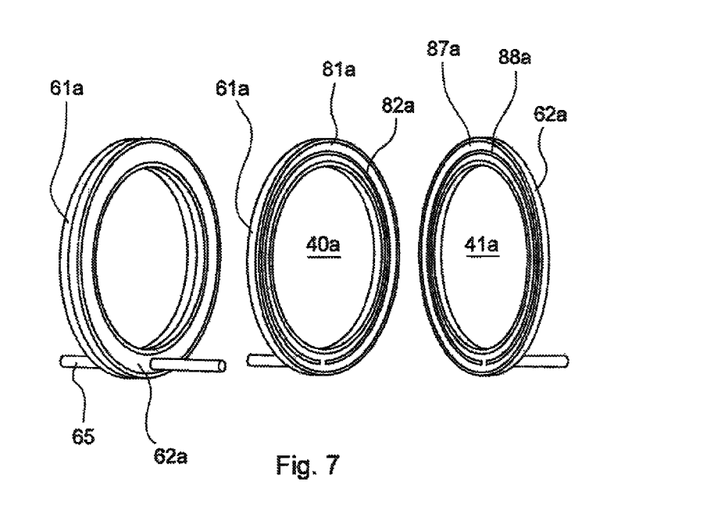

The 3D models shown in FIG. 7 illustrate the physical geometry that has been simulated. The 3D model on the left side of FIG. 7 shows the two half-couplers 40*a* and 41*a* in contact, for a zero-degree angle of rotation. The 3D model on the center of FIG. 7 shows the first half-coupler 40*a*. The 3D model on the right side of FIG. 7 shows the second half-coupler 41*a*. As can be seen, each half-coupler comprises a circular copper housing (61*a*, 62*a*) having a U-shaped cross-section, inside of which is placed a first layer (i.e. rear layer) of dielectric material 81*a* or 87*a* (glass-loaded PTFE) with a width of about 10 mm and a thickness of about 3.8 mm. Lying on the top of this first layer 81*a* or 87*a* is a gold-plated copper track 82*a* or 88*a* (or conducting strip) of width 2.0 mm and thickness 50 μm, which has the shape of a split ring connected at one end to the inner conductor of the incoming coax 65 and left open at the other end. The gap 821*a* or 881*a* between the ends of each split ring 82*a* or 88*a* is about 4 mm. Although not shown in the 3D models of FIG. 7, when the elements are assembled, there is yet another layer 83*a* or 89*a* (i.e. front layer) of dielectric material of thickness of about 0.9 mm placed on top of each gold-plated copper track 82*a* or 88*a* to complete the stack of materials in each half-coupler. These front layers of dielectric material serve to ensure that the gold-plated copper tracks have the desired physical separation. The total thickness of the metal and dielectric layers in this example is about 9.5 mm.

Figure 10:
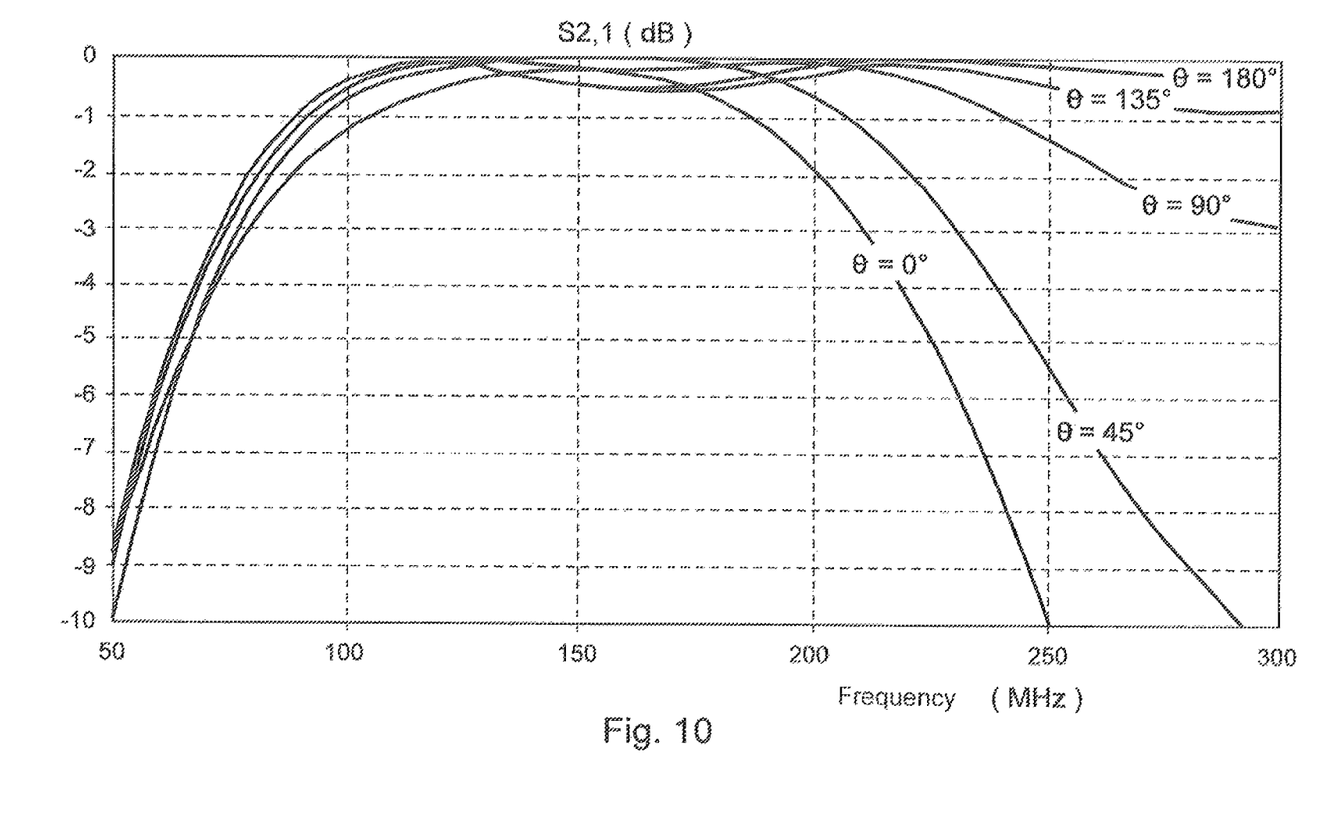
FIG. 10 depicts the S21 frequency responses of the coupler of FIG. 7.

Results of the 3D electromagnetic simulation of the coupler according to the first embodiment of FIGS. 6*a* and 6*b* are shown in FIG. 10. FIG. 10 shows the S21 frequency responses of the coupler, obtained for different rotation (i.e. 0°, ±45°, ±90°, ±135° and 180°) of the first half-coupler 40*a* around the second half-coupler 40*b*, around an axis of rotation passing through the center of the coupler and substantially parallel to the length of the coaxial cable. As can be seen, for angles of rotation from 0° to ±180°, insertion loss is substantially less than 0.5 dB between the frequencies of 125 and 180 MHz. Thus, in this particular example, the coupler of the invention has the advantage of maintaining a strong coupling between the conducting strips 82*a* and 88*a* (i.e. between the first and second sections of transmission line) for angular orientations from 0° to ±180° of the first section of drill pipe around the second section of drill pipe.

For example, a typical frequency of operation for the coupler of the present invention is about 150 MHz and the available bandwidth is 50 MHz. This implies, with the right modulation and coding, that data rates of about 50 Mbits/s can be reached. In comparison with the prior art coupling techniques presented above, the electromagnetic coupling technique of the present invention allows much higher data rates.

In the following, two further embodiments of the coupler of the present invention will be described in relation to FIGS. 8*a*, 8*b*, 9*a* and 9*b* to illustrate the scope of the present invention.

FIGS. 8*a* and 8*b* present a second particular embodiment of the coupler of the present invention.

In this second particular embodiment, the transmission line 66 is an unbalanced coaxial cable, i.e. a coaxial cable comprising one inner conductor 661 and one outer conductor 662, with a characteristic impedance in the range of about 30 to about 120 ohms, most preferably with a characteristic impedance in the range of 50 to 75 ohms. In this second embodiment, the coaxial cable has transmission losses less than 1.67 dB/10 m for frequencies below 500 MHz.

As shown in the example of FIG. 8*b*, the multi-layer disc of dielectric material of the first half-coupler 40*b* comprises a rear layer 81*b* of dielectric material extending in the bottom of the first housing 61*b* and a front layer 83*b* of dielectric material extending around the opening of the first housing 61*b*. The multi-layer disc of dielectric material of the second half-coupler 41*b* comprises a rear layer 87*b* of dielectric material extending in the bottom of the second housing 62*b* and a front layer 89*b* of dielectric material extending around the opening of the second housing 62*b*.

In operation, i.e. when the first and second sections of drill pipe are connected end-to-end, the first 61*b* and second housings 62*b* come into contact to form together an electromagnetic cavity C2, inside which the conducting strips 82*b* and 88*b* are electromagnetically coupled. Thus, in operation, and by judicious choice of the geometric shape of the conducting strips 82*b* and 88*b*, their length and separation, it is possible to achieve a very low-loss radiofrequency (RF) transmission of signals between the conducting strips 82*a* and 88*a* over a wide range of frequencies. To this end, dielectric layer 83*b* and 89*b* may be of the same material and in the same close contact configuration than dielectric layers 83*a* and 89*a*.

As can be seen in FIG. 8*a*, each of the first and second half-couplers 40*b* and 41*b* is shown with the appropriate layer of dielectric material removed (83b and 89b, respectively), so as to reveal the shape of each of the conducting strips 82b and 88b beneath.

In this second particular embodiment, each of the conducting strips 82b and 88b has the shape of a full ring. In the example of FIG. 8a, the first full ring 82b of the first half-coupler 40b and the second full ring 88b of the second half-coupler 41b are identical in shape and in size.

In operation, i.e. when the first and second sections of drill pipe are connected end-to-end, the full rings 82b and 88b are facing each other. In this second particular embodiment, the connection point 91b of the first full ring 82b and the connection point 92b of the second full ring 88b are diametrically opposed to each other, when the full rings 82b and 88b are facing each other. Optimum coupling characteristics are achieved with the rings in this position. The centre frequency of the pass band for this second particular embodiment of the coupler is twice that of the first particular embodiment of the coupler presented above in relation with FIGS. 6a and 6b.

As shown in the example of FIG. 8a, each full ring comprises a short circuit point 91c and 92c. In the example of FIG. 8b, each short circuit is realized as a metal post 95 and 96 which connects the respective short circuit point 91c and 92c of the respective full ring 82b and 88b to the ground plane underneath (i.e. the respective housing 61b and 62b).

In this second particular embodiment, the short circuit point 91c and the connection point 91b of the first full ring 82b are diametrically opposed to each other. The short circuit point 92c and the connection point 92b of the second full ring 88b are diametrically opposed to each other. Thus, in operation, the connection point 91b of the first full ring 82b is facing the short circuit point 92c of the second full ring 88b, and the connection point 92b of the second full ring 88b is facing the short circuit point 91c of the first full ring 82b. This arrangement permits maintaining high coupling characteristic for angles of rotation (of one drill pipe with respect to another drill pipe) up to 135°.

FIGS. 9a and 9b present a third particular embodiment of the coupler of the present invention.

In this third particular embodiment, the transmission line 67 is a balanced coaxial cable (also called "coax twin"), i.e. a coaxial cable comprising a first inner conductor 671, a second inner conductor 672 and one outer conductor 673, with a characteristic impedance in the range of about 50 to about 180 ohms, most preferably with a characteristic impedance in the range of 100 to 150 ohms. In this third embodiment, the coax twin has transmission losses less than 1.67 dB/10 m for frequencies below 500 MHz.

In FIG. 9a, each of the first and second half-couplers 40c and 41c is shown with the appropriate layer of dielectric material removed (83c and 87c, respectively) so as to reveal the shape of each of the conducting strips 82c, 82d, 88c and 88d beneath.

In this third particular embodiment, each half-coupler comprises two portions of ring. In the example of FIG. 9a, each portion of ring has the shape of a half-ring. The first half-coupler 40c comprises two half-rings 82c and 82d, and the second half-coupler 41c comprises two half-rings 88c and 88d. To this end, dielectric layer 83c and 89c may be of the same material and in the same close contact configuration than dielectric layers 83a and 89a.

At the first half-coupler 40c level, the connection point 821c of the half-ring 82c is connected to the first inner conductor 671 of the coax twin, and the connection point 821d of the half-ring 82d is connected to the second inner conductor 672 of the coax twin. At the second half-coupler 41c level, the connection point 881c of the half-ring 88c is connected to the second inner conductor 672 of the coax twin, and the connection point 881d of the half-ring 88d is connected to the first inner conductor 671 of the coax twin.

As can be seen in FIG. 9a, the connection point 821c of the half-ring 82c is separated from the connection point 821d of the half-ring 82d by a gap 901. The free end 822c of the half-ring 82c is separated from the free end 822d of the half-ring 82d by a gap 902. The gaps 901 and 902 are diametrically opposed to each other. The gaps 901 and 902 avoid short circuit at the ends of the coax line. This arrangement provides the advantage that there is no longer any reliance on good continuity between the copper housings of the two half-couplers. Ground continuity is no longer needed.

The connection point 881c of the half-ring 88c is separated from the connection point 881d of the half-ring 88d by a gap 903. The free end 882c of the half-ring 88c is separated from the free end 882d of the half-ring 88d by a gap 904. The gaps 903 and 904 are diametrically opposed to each other In operation, i.e. when the first and second sections of drill pipe are connected end-to-end, the half-ring 82c and the half-ring 88d are facing each other, and the half-ring 82d and the half-ring 88c are facing each other. In this third particular embodiment, the pair of connection points 821c and 821d of the first half-coupler 40c and the pair of connection points 881c and 881d of the second half-coupler 41c are diametrically opposed to each other, when in operation. Thus, in operation, the pair of connection points 821c and 821d is facing the gap 904, and the pair of connection points 881c and 881d is facing the gap 902. Optimum coupling characteristics are achieved with the half-rings in this position. The centre frequency of the pass band for this third particular embodiment of the coupler is twice that of the first particular embodiment of the coupler presented above in relation with FIGS. 6a and 6b.

Although the present disclosure has been described with reference to one or more examples, a person skilled in the art will recognize that changes may be made in form and detail without departing from the scope of the disclosure and/or the appended claims.

For example, in a possible embodiment, each half-coupler can comprise two or more concentric electrically conductive full rings, each ring having a connection point with a center conductor (or inner conductor) of an unbalanced coaxial cable or a coax twin cable.

It is possible to modify the embodiment presented in relation with FIGS. 8a and 8b such that the full rings 82b and 88b do not comprise any short-circuit point, and such that, in operation (i.e. when the first and second sections of drill pipe are connected end-to-end), the connection points 91b and 92b are still in relative position indicated in FIG. 8a.

Furthermore, it is possible to modify the embodiment presented in relation with FIGS. 9a and 9b such that each half-coupler 40c and 41c comprises only one half-ring comprising a single connection point with a central conductor (or inner conductor) of an unbalanced coaxial cable. This single connection point can be located either at one end of the half-ring or between the two ends of the half-ring.

Of course, the invention is not limited to the embodiments described and represented above, from which one could envisage other embodiments and other forms, without departing from the scope of the invention.

The invention claimed is:

1. A coupler for coupling a first and a second section of a transmission line embedded in a first and a second component respectively, comprising:
 a first half-coupler comprising a first non-magnetic, electrically conductive housing adapted to be mounted at an end of the first component, a first electrically conductive structure, and a first structure of dielectric material; and a second half-coupler comprising a second non-magnetic, electrically conductive housing adapted to be mounted at an end of the second component, a second electrically conductive structure, and a second structure of dielectric material, wherein the first section of the transmission line is electrically connected to the first conductive structure, the second section of the transmission line is electrically connected to the second conductive structure, and when the first and second components are connected end-to-end, the first and second housings come into contact to form together an electromagnetic cavity, inside which the first and second conductive structures are separated from each other by the first and second dielectric structures, so as to allow the first and second conductive structures to be in electromagnetic communication with each other, wherein the transmission line comprises at least one coaxial cable, each coaxial cable comprising at least one inner conductor and an outer conductor, and the outer conductor of each coaxial cable is connected to the first and second housings, and wherein each of the first and second conductive structures comprises a full ring made of an electrically conductive material, and each full ring comprises a connection point connected to one of the inner conductor(s), and a short circuit point diametrically opposed to the connection point and connected to the respective housing.

2. The coupler according to claim 1, wherein the first and second housings have a V-shaped cross-section.

3. The coupler according to claim 1, wherein each of the first and second dielectric structures and each of the first and second conductive structures is ring-shaped.

4. The coupler according to claim 1, wherein
each of the first and second conductive structures comprises at least one full ring made of an electrically conductive material, and
each full ring comprises at least one connection point, each connection point being connected to one of said inner conductor(s).

5. The coupler according to claim 1, wherein each of the first and second conductive structures comprises at least one portion of a ring, made of an electrically conductive material, each portion of ring comprising a first end and a second end, each end being separated from another end by a gap.

6. A coupler for coupling a first and a second section of a transmission line embedded in a first and a second component respectively, comprising:
a first half-coupler comprising a first non-magnetic, electrically conductive housing adapted to be mounted at an end of the first component, a first electrically conductive structure and a first structure of dielectric material; and
a second half-coupler comprising a second non- magnetic, electrically conductive housing adapted to be mounted at an end of the second component, a second electrically conductive structure, and a second structure of dielectric material,
wherein the first section of the transmission line is electrically connected to the first conductive structure, the second section of the transmission line is electrically connected to the second conductive structure, and when the first and second components are connected end-to-end, the first and second housing come into contact to form together an electromagnetic cavity, inside which the first and second conductive structures are separated from each other by the first and second dielectric structures, so as to allow the first and second conductive structures to be in electromagnetic communication with each other,
wherein the transmission line comprises at least one coaxial cable, each coaxial cable comprising at least one inner conductor and an outer conductor, and the outer conductor of each coaxial cable is connected to the first and second housings,
wherein each of the first and second conductive structures comprises at least one portion of a ring, made of an electrically conductive material, each portion of ring comprising a first end and a second end, each end being separated from another end by a gap, and
wherein each of the first and second conductive structures comprises a portion of a ring, made of an electrically conductive material and comprising a first end and a second end separated from each other by a gap, and
when the first and second components are connected end-to-end, the first and second conductive structures are facing each other such that:
the first end of the first conductive structure and the first end of the second conductive structure are opposite to each other;
the second end of the first conductive structure is located at one side of the first end of the first conductive structure; and
the second end of the second conductive structure is symmetrically located at the other side of the first end of the first conductive structure.

7. A coupler for coupling a first and a second section of a transmission line embedded in a first and a second component respectively, comprising:
a first half-coupler comprising a first non-magnetic, electrically conductive housing adapted to be mounted at an end of the first component, a first electrically conductive structure, and a first structure of dielectric material; and
a second half-coupler comprising a second non-magnetic, electrically conductive housing adapted to be mounted at an end of the second component, a second electrically conductive structure, and a second structure of dielectric material,
wherein the first section of the transmission line is electrically connected to the first conductive structure, the second section of the transmission line is electrically connected to the second conductive structure, and when the first and second components are connected end-to-end, the first and second housings come into contact to form together an electromagnetic cavity, inside which the first and second conductive structures are separated from each other by the first and second dielectric structures, so as to allow the first and second conductive structures to be in electromagnetic communication with each other,
wherein the transmission line comprises at least one coaxial cable, each coaxial cable comprising at least one inner conductor and an outer conductor, and the outer conductor of each coaxial cable is connected to the first and second housings,
wherein each of the first and second conductive structures comprises at least one portion of a ring, made of an electrically conductive material, each portion of ring comprising a first end and a second end, each end being separated from another end by a gap, and
wherein each first end is connected to one of said inner conductor(s), and each second end is free.

8. A coupler for coupling a first and a second section of a transmission line embedded in a first and a second component respectively, comprising:
- a first half-coupler comprising a first non-magnetic, electrically conductive housing adapted to be mounted at an end of the first component, a first electrically conductive structure, and a first structure of dielectric material; and
- a second half-coupler comprising a second non-magnetic, electrically conductive housing adapted to be mounted at an end of the second component, a second electrically conductive structure, and a second structure of dielectric material,
- wherein the first section of the transmission line is electrically connected to the first conductive structure, the second section of the transmission line is electrically connected to the second conductive structure, and when the first and second components are connected end-to-end, the first and second housing come into contact to form together an electromagnetic cavity, inside which the first and second conductive structures are separated from each other by the first and second dielectric structures, so as to allow the first and second conductive structures to be in electromagnetic communication with each other,
- wherein the transmission line comprises at least one coaxial cable, each coaxial cable comprising at least one inner conductor and an outer conductor, and the outer conductor of each coaxial cable is connected to the first and second housings,
- wherein each of the first and second conductive structures cormprises at least portion of a ring, made of an electrically conductive material, each portion of ring comprising a first end and a second end, each end being separated from another end by a gap, and
- wherein each first and second end is free, and each portion of ring comprises a connection point being located between the first end and the second end and being connected to one of said inner conductor(s).

9. The coupler according to claim 1, wherein
- each of the first and second housings comprises a bottom, a first side, a second side and an opening between the first and second sides,
- each of the first and second dielectric structures comprises a rear layer of dielectric material extending in the bottom of the respective housing, and a front layer of dielectric material extending around the opening of the respective housing, and
- each of the first and second conductive structures is mounted in-between the respective rear and front layers.

10. A system for transmitting data through a first and a second section of a transmission line embedded in a first and a second component respectively, wherein
- the first component comprises a first half-coupler at an end, the first half-coupler comprising a first non-magnetic, electrically conductive housing adapted to be mounted at an end of the first component, a first electrically conductive structure, and a first structure of dielectric material;
- the second component comprises at another end a second half-coupler, the second half-coupler comprising a second non-magnetic, electrically conductive housing adapted to be mounted at an end of the second component, a second electrically conductive structure, and a second structure of dielectric material,
- the first section of the transmission line is electrically connected to the first conductive structure, the second section of the transmission line is electrically connected to the second conductive structure, and when the first and second components are connected end-to-end, the first and second housings come into contact to form together an electromagnetic cavity, inside which the first and second conductive structures are separated from each other by the first and second dielectric structures, so as to allow the first and second conductive structures to be in electromagnetic communication with each other,
- wherein the transmission line comprises at least one coaxial cable, each coaxial cable comprising at least one inner conductor and an outer conductor, and the outer conductor of each coaxial cable is connected to the first and second housings, and
- wherein each of the first and second conductive structures comprises a full ring made of an electrically conductive material, and each full ring comprises a connection point connected to one of the inner conductor(s), and a short circuit point diametrically opposed to the connection point and connected to the respective housing.

11. The system according to claim 10, wherein each component is a drill pipe adapted to be used in oil and gas exploration or production.

12. A component, comprising:
- at a first end, a first half-coupler comprising a first non-magnetic, electrically conductive housing adapted to be mounted at an end of a first component having a first section of a transmission line, a first electrically conductive structure, and a first structure of dielectric material,
- at a second end, a second half-coupler comprising a second non-magnetic, electrically conductive housing adapted to be mounted at an end of a second component having a second section of the transmission line, a second electrically conductive structure, and a second structure of dielectric material,
- wherein the first section of the transmission line is electrically connected to the first conductive structure, the second section of the transmission line is electrically connected to the second conductive structure, and when the first and second components are connected end-to-end, the first and second housings come into contact to form together an electromagnetic cavity, inside which the first and second conductive structures are separated from each other by the first and second dielectric structures, so as to allow the first and second conductive structures to be in electromagnetic communication with each other,
- wherein the transmission line comprises at least one coaxial cable, each coaxial cable comprising at least one inner conductor and an outer conductor, and the outer conductor of each coaxial cable is connected to the first and second housings, and
- wherein each of the first and second conductive structures comprises a full ring made of an electrically conductive material, and each full ring comprises a connection point connected to one of the inner conductor(s), and a short circuit point diametrically opposed to the connection point and connected to the respective housing.

* * * * *